(12) United States Patent
Haran et al.

(10) Patent No.: US 11,211,324 B2
(45) Date of Patent: Dec. 28, 2021

(54) VIA CONTACT PATTERNING METHOD TO INCREASE EDGE PLACEMENT ERROR MARGIN

(71) Applicant: Intel Corporation, Santa Clara, CA (US)

(72) Inventors: Mohit K. Haran, Hillsboro, OR (US); Daniel James Bahr, Portland, OR (US); Deepak S. Rao, Portland, OR (US); Marvin Young Paik, Portland, OR (US); Seungdo An, Portland, OR (US); Debashish Basu, Beaverton, OR (US); Kilhyun Bang, Portland, OR (US); Jason W. Klaus, Portland, OR (US); Reken Patel, Portland, OR (US); Charles Henry Wallace, Portland, OR (US); James Jeong, Beaverton, OR (US); Ruth Amy Brain, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 16/574,308

(22) Filed: Sep. 18, 2019

(65) Prior Publication Data

US 2021/0082805 A1     Mar. 18, 2021

(51) Int. Cl.
*H01L 23/522*     (2006.01)
*H01L 21/768*     (2006.01)
*H01L 23/528*     (2006.01)
*H01L 23/532*     (2006.01)

(52) U.S. Cl.
CPC .... *H01L 23/5226* (2013.01); *H01L 21/76877* (2013.01); *H01L 23/5283* (2013.01); *H01L 23/5329* (2013.01)

(58) Field of Classification Search
None
See application file for complete search history.

(56) References Cited

U.S. PATENT DOCUMENTS

| 2004/0094810 A1* | 5/2004 | Maldei | H01L 27/10873 257/411 |
| 2017/0053997 A1* | 2/2017 | Cheng | H01L 29/6653 |

* cited by examiner

*Primary Examiner* — Bo B Jang
(74) *Attorney, Agent, or Firm* — Patent Capital Group

(57) ABSTRACT

An example via contact patterning method includes providing a pattern of alternating trench contacts and gates over a support structure. For each pair of adjacent trench contacts and gates, a trench contact is electrically insulated from an adjacent gate by a dielectric material and/or multiple layers of different dielectric materials, and the gates are recessed with respect to the trench contacts. The method further includes wrapping a protective layer of one or more dielectric materials, and a sacrificial helmet material on top of the trench contacts to protect them during the via contact patterning and etch processes for forming via contacts over one or more gates. Such a method may advantageously allow increasing the edge placement error margin for forming via contacts of metallization stacks.

20 Claims, 10 Drawing Sheets

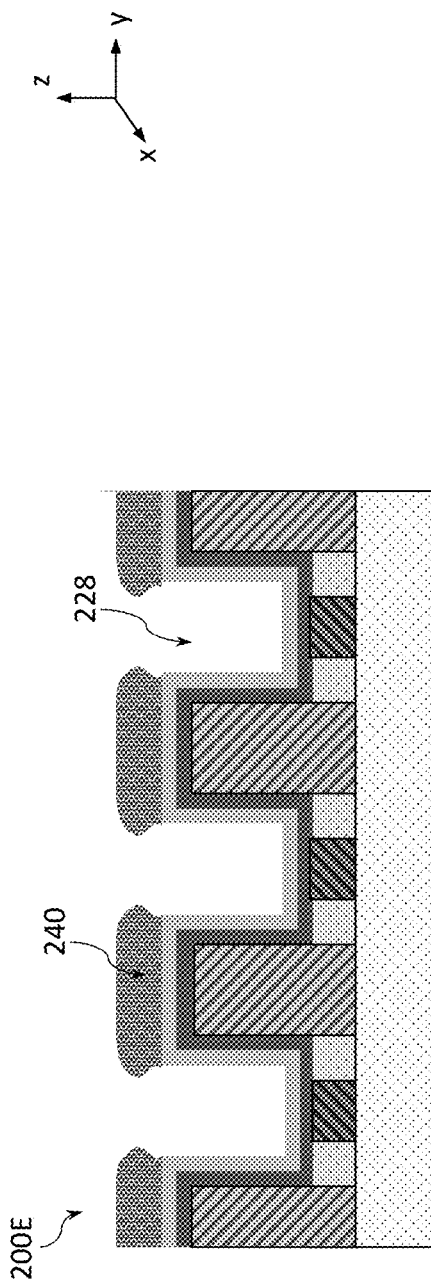
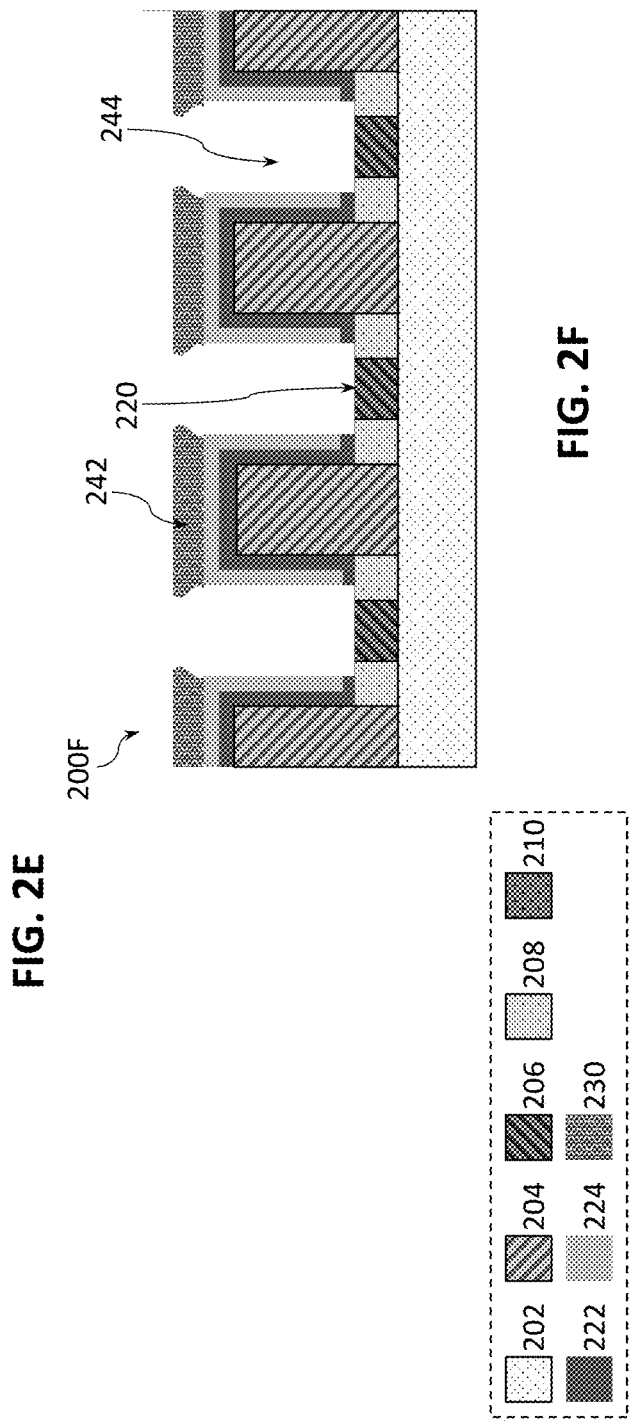

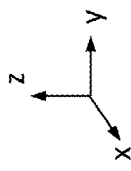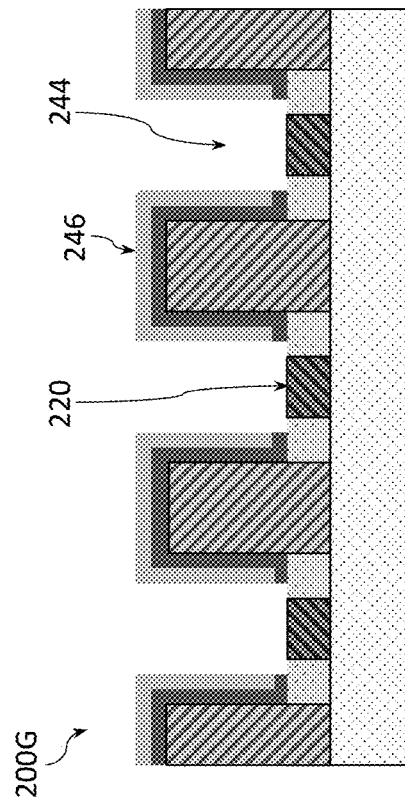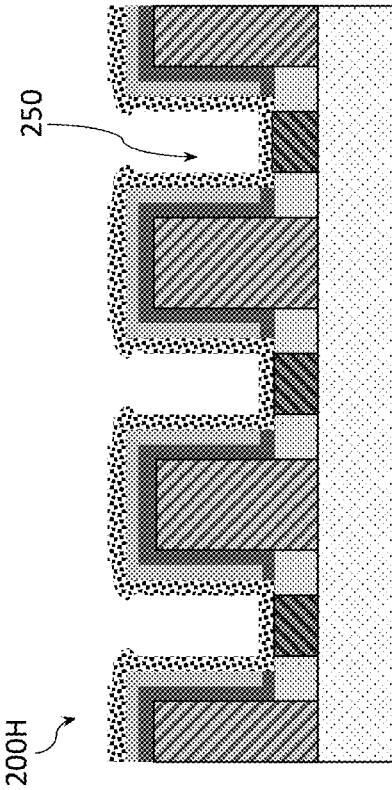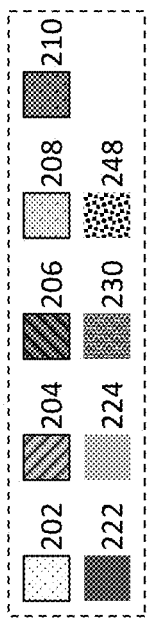

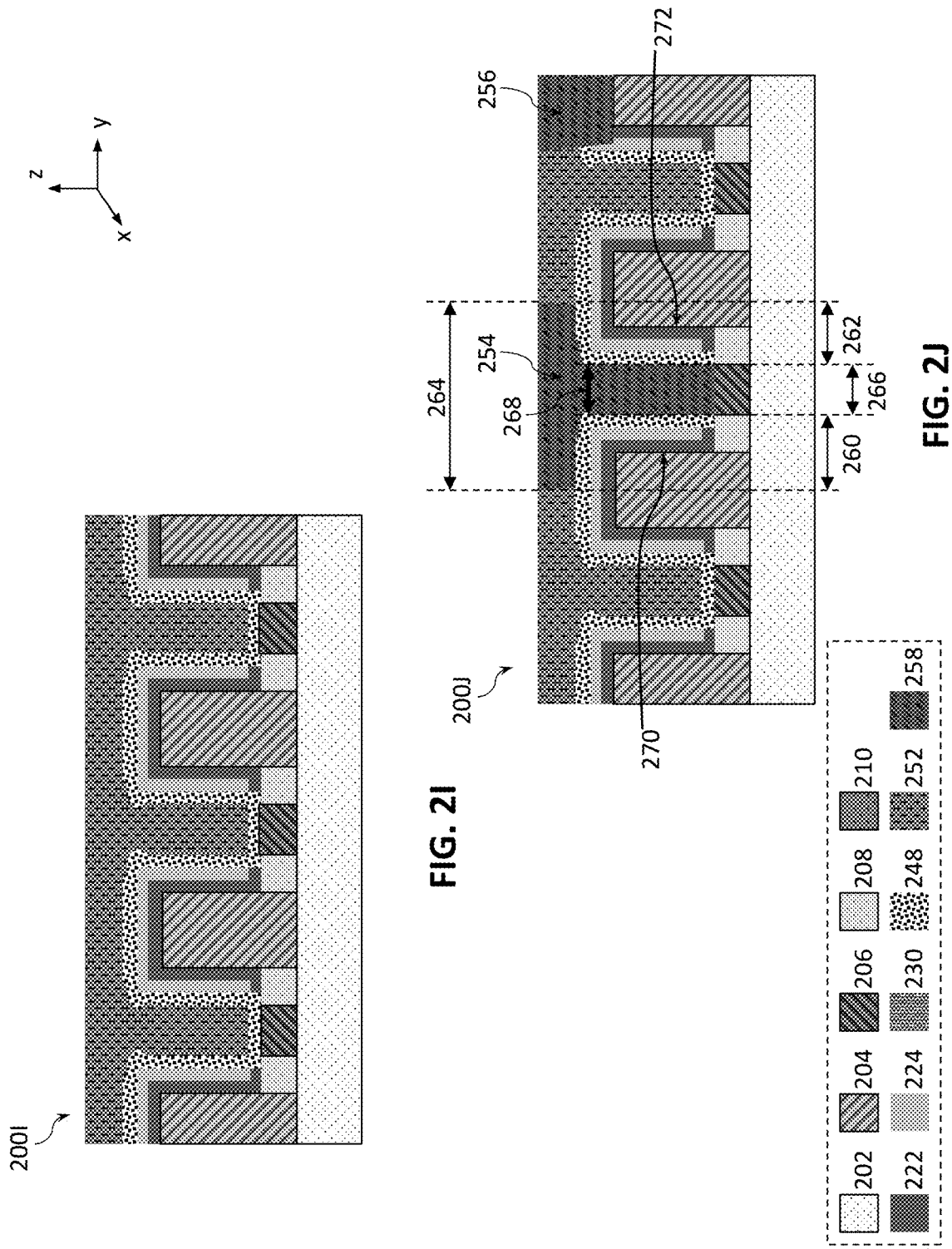

VIA CONTACT PATTERNING METHOD TO INCREASE EDGE PLACEMENT ERROR MARGIN

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2J illustrate various stages in the manufacture of an example integrated circuit (IC) structure according to the via contact patterning method of FIG. 1, in accordance with some embodiments.

DETAILED DESCRIPTION

Figure 1:
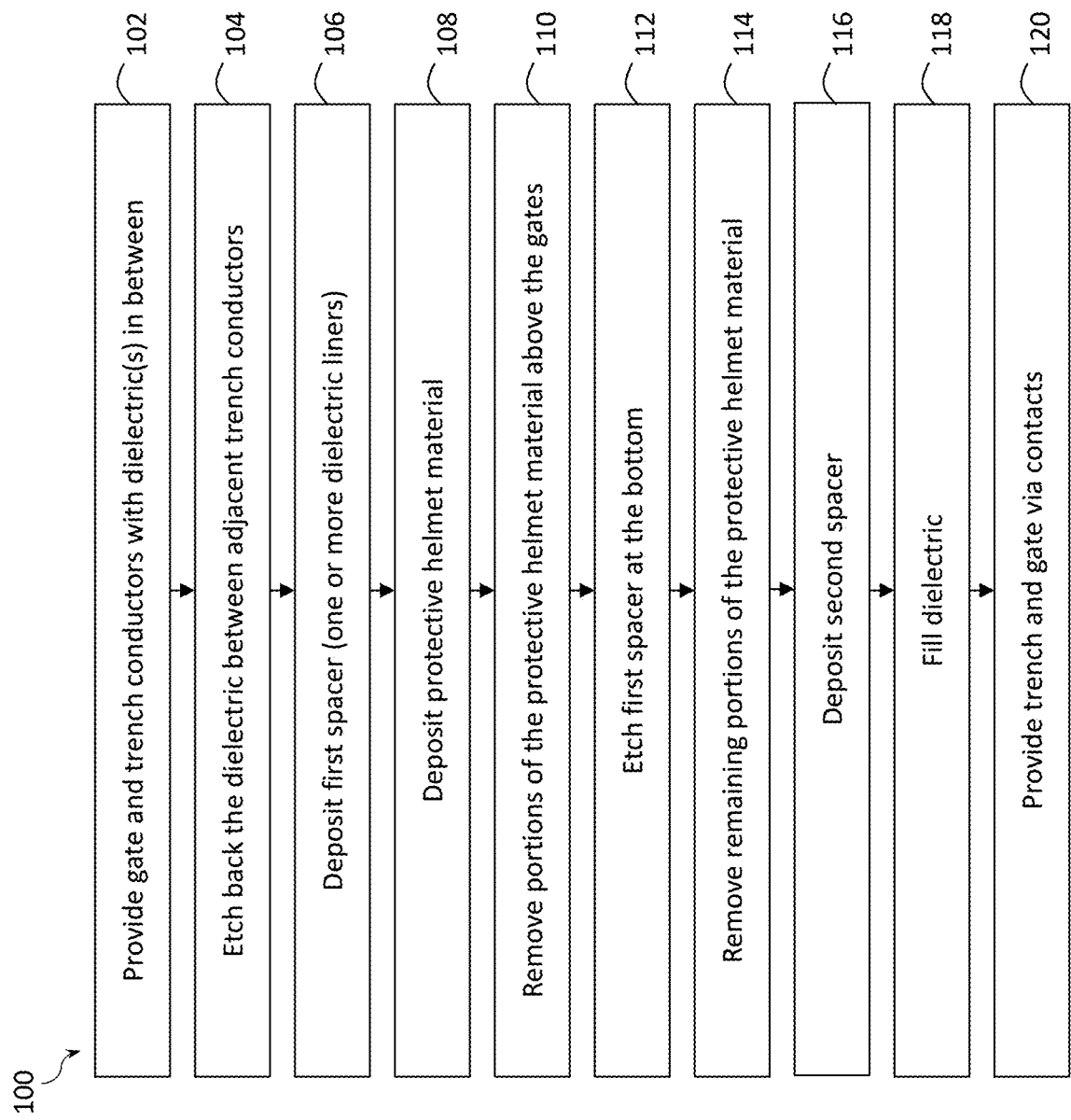
FIG. 1 is a flow diagram of an example via contact patterning method of providing a metallization stack having one or more via contacts over underlying electrically conductive structures, in accordance with some embodiments.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating a via contact patterning method described herein, it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

ICs commonly include electrically conductive microelectronic structures, which are known in the arts as vias, to electrically connect metal lines or other interconnects above the vias to metal lines or other interconnects below the vias. In this context, the term "metallization stack" may be used to describe a stacked series of electrically insulated metallic interconnecting wires that are used to connect together various devices of an IC, where adjacent layers of the stack are linked together through the use of electrical contacts and vias.

Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer, which may be referred to as a via location opening. Next, an opening for the via may be etched in the dielectric layer by using the location opening in the photoresist layer as an etch mask. This opening in the dielectric layer is referred to as a via opening. Finally, the via opening may be filled with one or more metals or other conductive materials to form the via.

In the past, the sizes and the spacing of vias have progressively decreased, and it is expected that in the future the sizes and the spacing of the vias will continue to progressively decrease, for at least some types of ICs (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the underlying electrically conductive structures (e.g., gate and trench contacts) generally need to be controlled to high tolerances on the order of a quarter of the via pitch. Edge placement error margin is a measure of how much misalignment between a via and the underlying electrically conductive structure on which the via was supposed to land may be tolerated.

Etch selectivity between two different materials used to protect different electrically conductive structures on which different vias are supposed to land may be used to ensure that proper contacts between different vias and different underlying structures are made. However, as via pitches scale ever smaller over time, the etch selectivity may not be enough to allow adequate over-etch to ensure no open contacts or shorts at small dimensions.

Disclosed herein are via contact patterning methods for manufacturing an IC structure, e.g., for manufacturing a metallization stack portion of an IC structure, including a plurality of via contacts provided over different electrically conductive structures, and related semiconductor devices. In the following descriptions, electrically conductive structures of a first type are referred to as "trench contacts" (or, sometimes, interchangeably, "trenches") while electrically conductive structures of a second type are referred to as "gates," and via contacts to these structures are referred to as "trench vias" and "gate vias," respectively. However, these descriptions are applicable to any other types of electrically conductive structures, not necessarily trench contacts and/or transistor gates, and cover embodiments where "trench contacts" described herein are replaced with a general term of "first electrically conductive structures" and where "gates" described herein are replaced with a general term of "second electrically conductive structures." In general, such first and second electrically conductive structures are considered to be different structures because a via contact made to one of those should not short to a via contact to another one and because, to help ensure this, the via contact patterning method described herein uses the difference in height of these structures and different types of protection during patterning of via contacts of these structures. However, in some embodiments, the general purpose of the first and second electrically conductive structures in an IC may (but does not have to) be the same—for example, both may be transistor gates, or both may be trenches.

In one aspect, an example method includes providing a pattern of alternating trench contacts and gates (or, generally, a pattern of alternating first and second electrically conductive structures) over a support structure (e.g., a substrate). For each pair of adjacent trench contacts and gates, a trench contact is electrically insulated from an adjacent gate by a dielectric material and/or multiple layers of different dielectric materials, and the gates are recessed with respect to the trench contacts (e.g., the trench contacts are taller, or, phrased differently, extend farther away from the support structure, than the gates). The method further includes wrapping a protective layer of one or more dielectric materials, and a sacrificial material referred to herein as a "helmet" material (or, simply, "helmet") on top of the taller structures (e.g., on top of the trench contacts) to protect the taller structures during the via contact patterning and etch processes for forming via contacts over one or more of the gates. Such a method may advantageously allow forming contacts over active gates (or, generally, any second electrically conductive structures) without having the difficult problem of choosing materials with adequate etch selectivity and height variation of the trench via contacts (or, generally, via contacts over any first electrically conductive structures) due to metal recess variability. Furthermore, the method may help prevent or at least reduce shorting of the trench via contacts to gates through the use of vertical separation (i.e., the height difference) of the trench contacts and gates, as described herein. As a result, the edge placement error margin for forming via contacts of IC structures may, advantageously, be increased.

IC structures as described herein, in particular metallization stacks with via contacts provided for different electrically conductive structures as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "high-k dielectric" refers to a material having a higher dielectric constant than silicon oxide while a "low-k dielectric" refers to a material having a lower dielectric constant than silicon oxide. In another example, a term "interconnect" is used to describe any element formed of an electrically conductive material for providing electrical connectivity to one or more components associated with an IC or/and between various such components. In general, the "interconnect" may refer to both trench contacts (also sometimes referred to as "lines") and vias. In general, a term "trench contact" is used to describe an electrically conductive element isolated by a dielectric material typically comprising an interlayer low-k dielectric that is provided within the plane of an IC chip. Such trench contacts are typically stacked into several levels, or several layers of metallization stacks. On the other hand, the term "via" is used to describe an electrically conductive element that interconnects two or more trench contacts of different levels. To that end, vias are provided substantially perpendicularly to the plane of an IC chip. A via may interconnect two trench contacts in adjacent levels or two trench contacts in not adjacent levels. A term "metallization stack" refers to a stack of one or more interconnects for providing connectivity to different circuit components of an IC chip. The terms "substantially," "close," "approximately," "near," and "about," generally refer to being within +/−20% of a target value based on the context of a particular value as described herein or as known in the art.

Figure 2A:
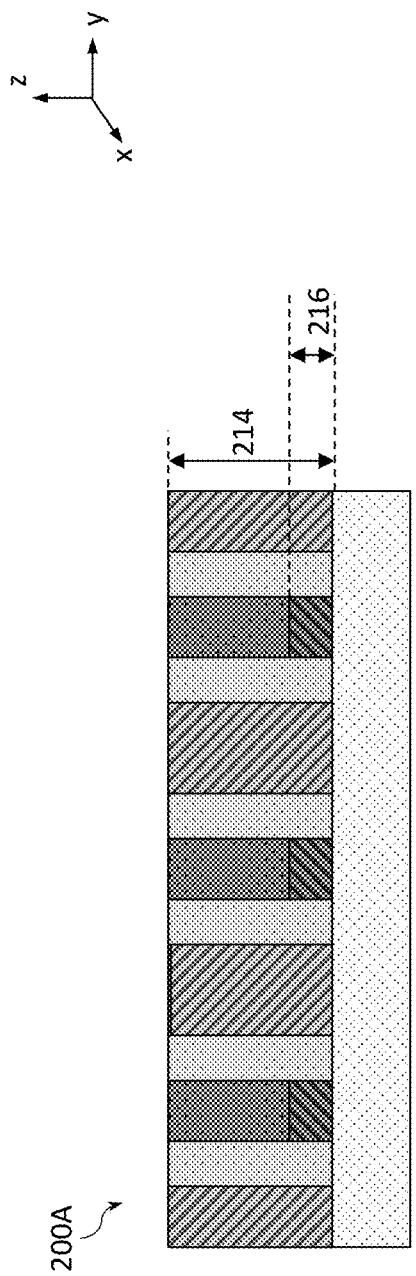

FIG. 1 is a flow diagram of an example via contact patterning method 100 of providing an IC structure having one or more via contacts over underlying electrically conductive structures, in accordance with some embodiments. FIGS. 2A-2J illustrate cross-sectional side views for various stages in the manufacture of an example IC structure 200 (e.g., the IC structure 200A shown in FIG. 2A, 200B shown in FIG. 2B, and so on until 200J shown in FIG. 2J) according to the via contact patterning method 100, in accordance with some embodiments. In particular, each of FIGS. 2A-2J illustrates a cross-section of the IC structure 200 taken along the y-z plane of the reference coordinate system x-y-z shown in FIGS. 2A-2J).

In FIGS. 2A-2J, only one of certain elements may be labeled with a reference numeral but several of those may be illustrated. A number of elements labeled in FIGS. 2A-2J with reference numerals are illustrated in these figures with different patterns, with a legend showing the correspondence between the reference numerals and patterns being provided at the bottom of each drawing page containing FIGS. 2A-2J. In particular, the legend illustrates that FIGS. 2A-2J use different patterns to show a support structure 202, trench contacts (or, more generally, first electrically conductive structures) 204, gates (or, more generally, second electrically conductive structures) 206, etc. Furthermore, although a certain number of a given element may be illustrated in FIGS. 2A-2J (e.g., 4 trench contacts 204 and 3 gates 206), this is also simply for ease of illustration, and more, or less, than that number may be included in an IC structure according to various embodiments of the present disclosure. Still further, various IC structure views shown in FIGS. 2A-2J are intended to show relative arrangements of various elements therein, and that various IC structures, or portions thereof, may include other elements or components that are not illustrated (e.g., transistor portions under the gates 206 are not illustrated, or components that may be in electrical contact with the trench contacts 204 and may be below the trench contacts 204 are also not illustrated).

Turning to FIG. 1, the method 100 may begin with a process 102 that includes providing trench contact and gate conductors with one or more dielectric materials in between as to electrically insulate individual ones of the conductors from one another. An IC structure 200A, depicted in FIG. 2A, illustrates an example result of the process 102. As shown in FIG. 2A, the IC structure 200A may include a support structure 202, a plurality of trench contacts 204, and a plurality of gates 206. One or more dielectric materials 208 may be provided between each adjacent trench contact 204 and gate 206 to electrically isolate them from one another. As further shown in FIG. 2A, the trench contacts 204 may be made higher than the gates 206, i.e., the gates 206 may be recessed with respect to the trench contacts 204, and the remaining space above the recessed gates 206 may be filled with a further dielectric material 210 may be provided. Dimension 214 shown in FIG. 2A refers to the height of the trench contacts 204, while dimension 216 refers to the height of the gates 206. In some embodiments, the height 214 may be between about 50 and 100 nanometers, including all values and ranges therein. In various embodiments, the difference between the height 214 and the height 216 may be between about 50 and 100 nanometers, including all values and ranges therein.

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments the support structure 202 may include any such substrate, possibly with some layers and/or devices already formed thereon, not specifically shown in the present figures, providing a suitable surface for forming the trench contacts 204 and the gates 206 thereon.

The trench contacts 204 and the gates 206 may be formed of any suitable electrically conductive materials (conductors). Such materials may include any suitable electrically conductive material, alloy, or a stack of multiple electrically conductive materials. In some embodiments, various electrically conductive materials described herein may include one or more metals or metal alloys, with metals such as ruthenium, palladium, platinum, cobalt, nickel, hafnium, zirconium, titanium, tantalum, and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g. hafnium nitride, zirconium nitride, titanium nitride, tantalum nitride, and aluminum nitride) of one or more metals.

Specific to transistor gates, the gates 206 may include any suitable workfunction metals, which may be different materials depending on whether a transistor for which an individual one of the gates 206 is provided is a P-type metal oxide semiconductor (PMOS) transistor or an N-type metal oxide semiconductor (NMOS) transistor. For PMOS transistors, metals that may be used in different portions of the gates 206 may include, but are not limited to, ruthenium, palladium, platinum, cobalt, nickel, and conductive metal oxides (e.g., ruthenium oxide). For NMOS transistors, metals that may be used in different portions of the gates 206 include, but are not limited to, hafnium, zirconium, titanium, tantalum, aluminum, tungsten, alloys of these metals, and carbides of these metals (e.g., hafnium carbide, zirconium carbide, titanium carbide, tantalum carbide, and aluminum carbide, tungsten, tungsten carbide). In some embodiments, any of the gates 206 may include a stack of a plurality of gate electrode materials, where one or more material of the stack are workfunction materials as described herein and at least one material of the stack is a fill metal layer. Further materials/layers may be included next to the gates 206 for other purposes, such as to act as a diffusion barrier layer or/and an adhesion layer.

Also specific to transistor gates, in some embodiments, a gate dielectric material, not specifically shown in the present figures, may be provided between the gates 206 and the underlying transistor portions. In some embodiments, such a gate dielectric may include a stack of one or more gate dielectric materials. In some embodiments, gate dielectric materials may include one or more high-k dielectric materials. In various embodiments, the high-k dielectric materials of the gate dielectric associated with any of the gates 206 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric associated with any of the gates 206 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric during manufacture of the semiconductor device with the IC structure 200 to improve the quality of the gate dielectric.

In some embodiments, the one or more dielectric materials 208 may include one or more materials typically used as an interlayer dielectric (ILD) that may be deposited over and in between various interconnects of an IC structure. To that end, the one or more dielectric materials 208 may be formed using dielectric materials known for their applicability in ICs, such as low-k dielectric materials. Examples of dielectric materials that may be used as the dielectric material(s) 208 may include, but are not limited to, silicon dioxide ($SiO_2$), carbon-doped oxide (CDO), silicon nitride, fluorosilicate glass (FSG), and organosilicates such as silsesquioxane, siloxane, or organosilicate glass. In some embodiments, the one or more dielectric materials 208 may include organic polymers such as polyimide, polynorbornenes, benzocyclobutene, perfluorocyclobutane, or polytetrafluoroethylene (PTFE). Still other examples of low-k dielectric materials that may be used as the one or more dielectric materials 208 include silicon-based polymeric dielectrics such as hydrogen silsesquioxane (HSQ) and methylsilsesquioxane (MSQ). In some embodiments, the one or more dielectric materials 208 may include pores or air gaps to further reduce their dielectric constant.

Once the gates 206 have been recessed with respect to the trench contacts 204, the further dielectric material 210 may be used to fill in the recess openings above the gates 206. In some embodiments, the further dielectric material 210 may be any of the dielectric materials described with respect to the one or more dielectric materials 208, although in various embodiments the exact material composition of the further dielectric material 210 and the one or more dielectric materials 208 may be different. In some embodiments, the further dielectric material 210 may include silicon nitride, silicon carbide, carbon-doped silicon oxide, or oxycarbide.

Figure 2B:
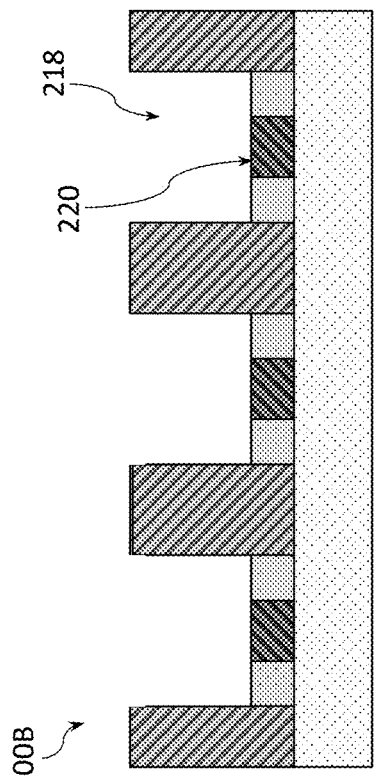

The method 100 may proceed with a process 104 that includes recessing the dielectric materials between pairs of adjacent trench contacts 204 to expose the surfaces of the gates 206. An IC structure 200B, depicted in FIG. 2B, illustrates an example result of the process 104. As shown in FIG. 2B, after the process 104, the IC structure 200A may become the IC structure 200B where openings 218 (only one of which is labeled in FIG. 2B) are made by removing the dielectric materials 208 and 210 between pairs of adjacent trench contacts 204, to expose the surfaces 220 (only one of which is labeled in FIG. 2B) of the gates 206. In various embodiments, the process 104 may include any suitable process for removing dielectric materials, e.g., any suitable etching technique. In some embodiments, the process 104 may include a wet etch technique, which typically results in isotropic etching (i.e., etching in all directions) of the dielectric materials 208 and 210, using etchants that would etch the dielectric materials 208 and 210 without substantially etching the trench contacts 204 and the gates 206. In other embodiments, the process 104 may include any suitable anisotropic etching technique (i.e., etching uniformly in a vertical direction) such as dry etch.

Figure 2C:
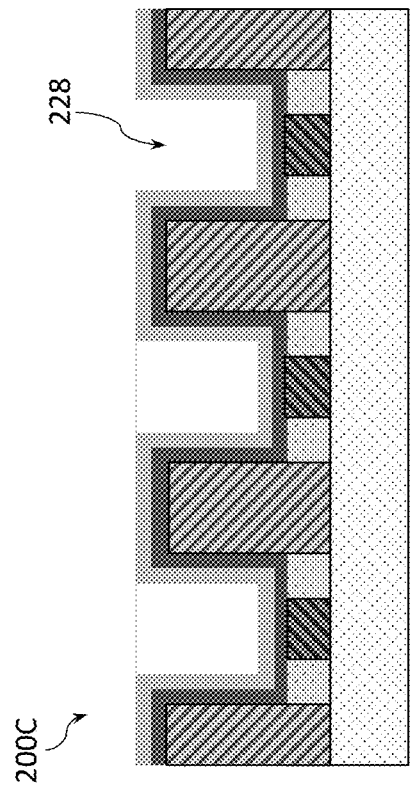

The method 100 may proceed with a process 106 that includes depositing a first spacer material over the IC structure 200B, i.e., over the trench contacts 204 and covering the sidewalls and bottoms of the openings 218. An IC structure 200C, depicted in FIG. 2C, illustrates an example result of the process 106. As shown in FIG. 2C, after the process 106, the IC structure 200B may become the IC structure 200C where sidewalls and bottoms of the openings 218 (i.e., sidewalls of the trench contacts 204 which were exposed by the dielectric recess of the process 104), as well as top portions of the trench contacts 204 are lined, first, with a dielectric material 222, and then lined with a dielectric material 224. The dielectric material 222 may, e.g., include any suitable dielectric material for protecting the trench contacts 204, such as silicon oxide (SiOx), SiOC, SiN, SiC, SiON, or SiOCN. The dielectric material 224 may, e.g., include any suitable dielectric material, such as tin oxide (SnOx), titanium oxide (TiOx), hafnium oxide (HfOx), tin oxide (SnOx), or aluminum oxide ($Al_2O_3$). Besides appropriate insulating properties, some other considerations in selecting a suitable material for the one or more dielectric materials 222, 224 of the first spacer provided in the process 106 may include, e.g., possibilities of smooth film formation, low shrinkage and outgassing, low electrical leakage, suitable value of a dielectric constant, and thermal stability. In some embodiments, only one of the dielectric materials 222, 224 may be used. In other embodiments, additional dielectric materials may be used to line the IC structure 200C after the dielectric materials 222 and 224 have been deposited. As a result of providing one or more dielectric liners in the process 106, the openings 218 may become smaller openings 228, as shown in FIG. 2C.

In various embodiments, the process 106 may include conformally depositing the first spacer, which may include one or more dielectric materials such as the materials 222 and 224, on the sidewalls and bottoms of the openings 218 and over the tops of the trench contacts 204. Conformal deposition generally refers to deposition of a certain coating (in this case—one or more of the dielectric materials 222 and 224 that will form the first spacer) on any exposed surface of a given structure (in this case—the IC structure 100B formed in the previous process, 104). A conformal coating may, therefore, be understood as a coating that is applied to exposed surfaces of a given structure, and not, for example, just to the horizontal surfaces. In some embodiments, the coating may exhibit a variation in thickness of less than 35%, including all values and ranges from 1% to 35%, such as 10% or less, 15% or less, 20% of less, 25% or less, etc. In some embodiments, the conformal coating of the process 106 may include chemical vapor deposition (CVD) or atomic layer deposition (ALD). In various embodiments, a thickness of any of the dielectric 222 and the dielectric 224 may be between about 5 and 15 nanometers, including all values and ranges therein, depending on the size of gates and the pitch.

Figure 2D:
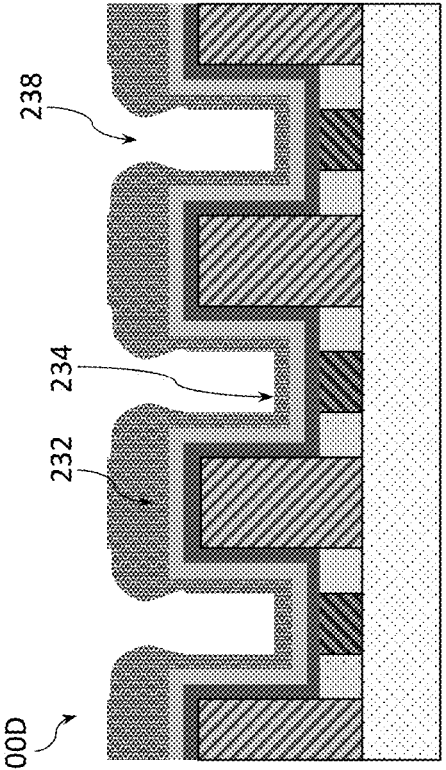

Next, the method 100 may proceed with a process 108 that includes depositing a protective helmet material over the IC structure 200C, i.e., over and between the trench contacts 204 lined with the first spacer. An IC structure 200D, depicted in FIG. 2D, illustrates an example result of the process 108. As shown in FIG. 2D, after the process 108, the IC structure 200C may become the IC structure 200D where a protective helmet material 230 has been deposited over and between the trench contacts 204 lined with the one or more of the dielectric materials 222 and 224. The protective helmet material 230 may be referred to as a "sacrificial material" because, as will be shown below, all or most of it will be removed after it has served its purpose of protecting the trench contacts 206, lined with the first spacer material, from being exposed when the first spacer material is removed at the bottoms of the openings 228 to expose, again, the gates 106. Therefore, etching properties of potential candidate materials are to be considered when selecting a suitable material to be used as the protective helmet material 230. Examples of materials that could be used as the protective helmet material 230 include, but are not limited to, silicon (Si), amorphous silicon (aSi), titanium nitride (TiN), titanium (Ti), aluminum oxide ($Al_2O_3$), titanium oxide (TiO2), or tungsten carbide (WC).

In various embodiments, the process 108 may include area selective deposition by geometry so that more of the protective helmet material 230 may be deposited on top of the trench contacts 204 (a portion of the protective helmet material 230 labeled in FIG. 2D as a portion 232) than on sidewalls and/or bottoms of the openings 228 (a portion of the protective helmet material 230 labeled in FIG. 2D as a portion 234). For example, in some embodiments, a thickness of the portion 232 may be between about 3 and 20 nanometers, while a thickness of the portion 234 may be between about 0 and 10 nanometers. As a result of depositing the protective helmet material 230 in the process 108, the openings 228 may become even smaller openings 238, as shown in FIG. 2D. In some embodiments, the protective helmet material 230 may be deposited more rapidly at the tops of the trench contacts 204 compared to the deposition rate in the relatively high aspect ratio openings 228. To that end, the process 108 may include selective deposition that may be accomplished by direction deposition, e.g., spinning the wafer during CVD deposition of the protective helmet material 230 and/or using a process that does not fill the openings 228 effectively.

The method 100 may then proceed with a process 110 that includes removing portions of the protective helmet material 230 above the gates 206. An IC structure 200E, depicted in FIG. 2E, illustrates an example result of the process 110. As shown in FIG. 2E, after the process 110, the IC structure 200D may become the IC structure 200E where the protective helmet material 230 may be removed at least above the gates 206, exposing the first spacer deposited in the process 106. In some embodiments, the process 110 may include also removing the protective helmet material 230 not only at the bottom of the openings 238 but also on the sidewalls of the openings 238, thus, again, resulting in the formation of openings 228 which were shown in FIG. 2C. Such embodiments may be realized by using anisotropic etching to remove the protective helmet material 230 in the process 110. FIG. 2E also illustrates that the removal of the protective helmet material 230 above the gates 206 may also result in the thickness of the upper portion of the protective helmet material 230 becoming smaller, said upper portion labeled in FIG. 2E as a portion 240 (shown for only one of the trench contacts 204).

Next, the method 100 may then proceed with a process 112 that includes removing portions of the first spacer above the gates 206. An IC structure 200F, depicted in FIG. 2F, illustrates an example result of the process 112. As shown in FIG. 2F, after the process 112, the IC structure 200E may become the IC structure 200F where the one or more dielectric materials 222, 224 may be removed above the gates 206, exposing, once again, the surfaces 220 of the gates 206. In some embodiments, the process 112 may include any suitable anisotropic etching technique, such as dry etch, to remove the first spacer above the gates 206 (i.e., at the bottom of the openings 228) but not on the sidewalls of the trench contacts 206 (i.e., not on the sidewalls of the openings 228). Dry etching techniques, such as plasma etching, are typically known to provide finer resolution and directionality of etching than wet etching techniques which typically result in isotropic etching. As a result of the process 112, the openings 228 become openings 244 where, additionally, the first spacer is removed to expose the surfaces 220 of the gates 206.

FIG. 2F also illustrates that, in some embodiments, the removal of the first spacer above the gates 206 in the process 112 may also result in removal of some of the protective helmet material 230 of the upper portions 240, resulting in the thickness of the upper portion 240 of the protective helmet material 230 becoming even smaller, said reduced upper portion labeled in FIG. 2F as a portion 242 (shown for only one of the trench contacts 204).

Once the first spacer has been removed to expose the gates 206, the protective helmet material 230 has served its purpose and what is remaining of this material may be removed in a process 114. An IC structure 200G, depicted in FIG. 2G, illustrates an example result of the process 114. As shown in FIG. 2G, after the process 114, the IC structure 200F may become the IC structure 200G where the one or more dielectric materials 222, 224 are present as in the IC structure 200C except for the areas above the gates 206. In FIG. 2G, the protective helmet material 230 has been removed to expose the upper surfaces 246 of the first spacer over the tops of the trench contacts 204. In some embodiments, any suitable wet or dry etching techniques may be used to remove the remaining portions of the protective helmet material 230 in the process 114. In other embodiments, other techniques, such as e.g., chemical-mechanical polishing/planarization (CMP) may be used to remove the upper portions 242 of the protective helmet material 230. CMP may be understood as a process that utilizes a polishing surface, an abrasive and a slurry to remove the overburden a material which may cover upper surfaces of an IC structure (in this case—to remove the remaining portions 242 of the protective helmet material 230) to expose the underlying surfaces.

The method 100 may proceed with a process 116 that includes depositing a second spacer material over the IC structure 200G. An IC structure 200H, depicted in FIG. 2H, illustrates an example result of the process 116. As shown in FIG. 2H, after the process 116, the IC structure 200G may become the IC structure 200H where sidewalls and bottoms of the openings 244 formed in the process 112, as well as top surfaces 246 are lined with the second spacer material 248. As a result of the process 116, the openings 244 become openings 250 which are smaller than the openings 244 because of the presence of the second spacer material 248 at the sidewalls and the bottom of the openings. The second spacer material 248 may, e.g., include any suitable dielectric material that may serve as an etch-stop material for the etching of the dielectric material 252 in a later process. Examples of the second spacer material 248 may include, but are not limited to, materials such as $Al_2O_3$, SnOx, or HfOx. In various embodiments, the process 116 may include conformally depositing the second spacer material 248 on the sidewalls and bottoms of the openings 244 and over the upper surfaces 246 above the trench contacts 204, e.g., using CVD or ALD. In various embodiments, a thickness of the second spacer material 248 may be between about 2 and 10 nanometers, including all values and ranges therein.

Next, a process 118 of the method 100 may include filling dielectric over the IC structure 200H. An IC structure 200I, depicted in FIG. 2I, illustrates an example result of the process 118. In some embodiments, all of the gates may be opened at once before depositing the dielectric 252. However, in some embodiments, some of the film 222 may be left to serve as an etch-stop layer. As shown in FIG. 2I, after the process 118, the IC structure 200H may become the IC structure 200I where the openings 250 are completely filled with a dielectric material 252, and there may be an overburden of the dielectric material 252 over the top of the trench contacts as well. The dielectric material 252 may, e.g., include any IDL materials described above. In various embodiments, the process 118 may use techniques such as spin-coating, dip-coating, CVD, ALD, or plasma-enhanced CVD (PECVD) to deposit the dielectric material 252. In some embodiments, the process 118 may include performing planarization, e.g., using CMP, once the dielectric material 252 has been deposited.

The method 100 may conclude with a process 120, in which one or more trench contact and/or gate via contacts are provided in openings etched in the dielectric material 252. An IC structure 200J, depicted in FIG. 2J, illustrates an example result of the process 120. As shown in FIG. 2J, after the process 120, the IC structure 200I may become the IC structure 200J where a gate via contact 254 and/or a trench via contact 256 are provided, each of which may be of an electrically conductive material 258. In various embodiments, the electrically conductive material 258 may include one or more of aluminum, copper, tungsten, cobalt, ruthenium, nickel, iron, and molybdenum, and/or one or more alloys comprising aluminum, copper, tungsten, cobalt, ruthenium, manganese, magnesium, titanium nitride, tungsten carbide, boron, phosphorus, nitrogen, carbon, and sulfur, and may be deposited any suitable deposition techniques, possibly in combination with patterning. In various embodiments, the gate via contact 254 and the trench via contact 256 may have the same or different material composition.

FIG. 2J illustrates that, for the gate via contact 254, the electrically conductive material 258 may interface the electrically conductive material of the gate 206, in order to make electrical contact. This means that the second spacer material 248, and the one or more dielectric materials 222, 224 of the first spacer are removed at least from the bottom of the opening 250 in order to make said electrical contact to the gate 206. Although not specifically shown in FIG. 2J, in some embodiments, the second spacer material 248 may also be removed from the sidewalls of the opening 250 (i.e., only the one or more dielectric materials 222, 224 of the first spacer may remain on the sidewalls 270 and 272 labeled in FIG. 2J) before the electrically conductive material 258 is deposited. Removal of these materials to expose the gate 206 may either be performed as a part of the process 120, before depositing the electrically conductive material 258, or as a part of the process 118, before depositing the dielectric material 252 (although the latter has not been shown in the present drawings). Similarly, FIG. 2J illustrates that, for the trench via contact 256, the electrically conductive material 258 may interface the electrically conductive material of the trench contact 204, in order to make electrical contact. This means that the second spacer material 248, and the one or more dielectric materials 222, 224 of the first spacer are removed in order to make said electrical contact to the trench contact 204. Removal of these materials to expose the trench contact 204 may either be performed as a part of the process 120, before depositing the electrically conductive material 258, or as a part of the process 118, before depositing the dielectric material 252 (although the latter has not been shown in the present drawings). If the process 120 follows the process 118 as a result of which there is still the second spacer material 248 provided at the bottom of the openings 250 (i.e., above the gates 206), then the process 120 may include a breakthrough step in which an etch of the second spacer material 248 is performed to expose the surface of the gate 206 over which the gate contacts 254 is to be provided. Such an etch may, e.g., include anisotropic etching.

FIG. 2J illustrates that the method 100 allows increasing the edge placement error margin for forming via contacts because, e.g., the electrically conductive material 258 for the gate contact 254 may be inadvertently provided in regions 260 and/or 262 over the trench contact 204. However, the second spacer 248 and the one or more dielectric materials 222, 224 of the first spacer protect the trench contact 204 so that the gate contact 254 does not form a short-circuit with the trench contact 204. Therefore, presence of the electrically conductive material 258 above the trench contacts 204 in the regions 260 and/or 262 may be indicative of the use of the via contact patterning method 100 described herein. Thus, in some embodiments, for a given gate contact 254, a width of the electrically conductive material 258 above the layer of the trench contacts 204 (said width labeled in FIG. 2J as a width 264) may be greater than a width of the electrically conductive material 258 near or at the interface with the gate 206 (said width labeled in FIG. 2J as a width 266). For example, in some embodiments, the width 264 may be at least 50% of the space between the adjacent gates. In some embodiments, an overlap between the gate contact 254 and one or both of the adjacent trench contacts 204 (i.e., a width of the regions 260 or 262) may be between about 10 and 30 nanometers, including all values and ranges therein.

In some embodiments, another feature in the IC structure 200J which may be indicative of the use of the via contact patterning method 100 is that a width of the electrically conductive material 258 between two horizontal portions of the second spacer material 248 (said width labeled in FIG. 2J as a width 268) may be smaller than the width 266 of the electrically conductive material 258 near or at the interface with the gate 206. For example, in some embodiments, the width 268 may be at least 50% of the space between the adjacent gates or trench contact contacts.

Furthermore, for a given gate contact 254, another feature in the IC structure 200J which may be indicative of the use of the via contact patterning method 100 is the presence the dielectric material 208 on the sides of the gate 206, where the dielectric material 208 has a different material composition from the dielectric materials 222, 224, and/or 248 above the gate 206 (i.e., on the sidewalls of the gate via contact 254).

Yet another feature in the IC structure 200J which may be indicative of the use of the via contact patterning method 100 is the presence of at least two layers of different dielectric materials on the sidewalls of the adjacent trench contacts 204—namely, the presence of the second spacer material 248 and the presence of the one or more dielectric materials 222, 224 of the first spacer on a sidewall 270 of one of the trench contacts 204 and on a sidewall 272 of an adjacent one of the trench contacts 204 (the sidewall 264 facing the sidewall 266).

The IC structures with via contacts formed by the via contact patterning method disclosed herein may be included in any suitable electronic device. FIGS. 3-6 illustrate various examples of apparatuses that may include one or more of the IC structures disclosed herein.

Figure 3B:
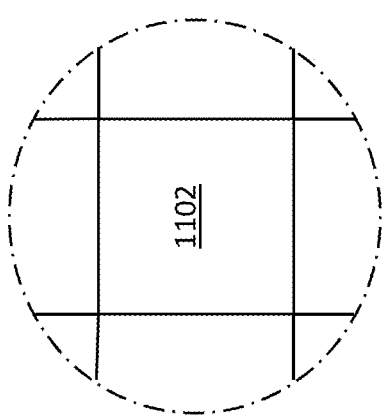
FIGS. 3A and 3B are top views of a wafer and dies that include one or more IC structures with via contacts formed by the via contact patterning method in accordance with any of the embodiments disclosed herein.
Figure 3A:
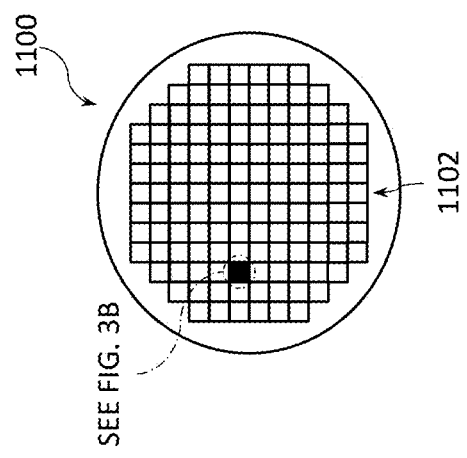

FIGS. 3A and 3B are top views of a wafer and dies that include one or more IC structures with via contacts formed by the via contact patterning method in accordance with any of the embodiments disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC (e.g., the IC 200J as shown in FIG. 2J, or any further embodiments of such an IC). After the fabrication of the semiconductor product is complete (e.g., after manufacture of one or more IC structures with via contacts formed by the via contact patterning method as described herein, included in a particular electronic component, e.g. in a transistor or in a memory device), the wafer 1100 may undergo a singulation process in which each of the dies 1102 is separated from one another to provide discrete "chips" of the semiconductor product. In particular, devices that include a metallization stack as disclosed herein may take the form of the wafer 1100 (e.g., not singulated) or the form of the die 1102 (e.g., singulated). The die 1102 may include one or more transistors (e.g., one or more of the transistors 1240 of FIG. 4, discussed below) and/or supporting circuitry to route electrical signals to the transistors, as well as any other IC components (e.g., one or more of the via contacts formed by the via contact patterning method as discussed herein, which may take the form of any of the metallization stacks described herein). In some embodiments, the wafer 1100 or the die 1102 may include a memory device (e.g., a static random access memory (SRAM) device), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 6) or other logic that is configured to store information in the memory devices or execute instructions stored in the memory array.

Figure 4:
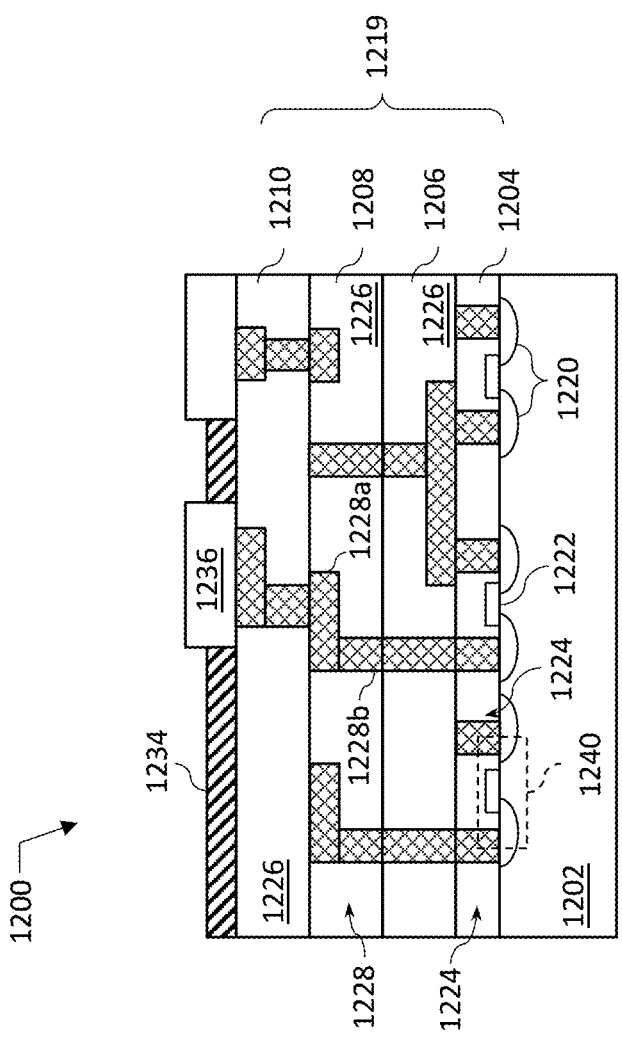
FIG. 4 is a cross-sectional side view of an IC device that may include one or more IC structures with via contacts formed by the via contact patterning method in accordance with any of the embodiments disclosed herein.

FIG. 4 is a cross-sectional side view of an IC device 1200 that may include one or more IC structures with via contacts formed by the via contact patterning method in accordance with any of the embodiments disclosed herein. The IC device 1200 may be formed on a substrate 1202 (e.g., the wafer 1100 of FIG. 3A) and may be included in a die (e.g., the die 1102 of FIG. 3B). The substrate 1202 may be any substrate as described herein. The substrate 1202 may be part of a singulated die (e.g., the dies 1102 of FIG. 3B) or a wafer (e.g., the wafer 1100 of FIG. 3A).

The IC device 1200 may include one or more device layers 1204 disposed on the substrate 1202. The device layer 1204 may include features of one or more transistors 1240 (e.g., metal oxide semiconductor field-effect transistors (MOSFETs)) formed on the substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 4 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1240 may include a gate 1222 formed of at least two layers, a gate electrode layer and a gate dielectric layer, as described above with reference to the gates 206.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross-section of the transistor 1240 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1240 may include one layer or a stack of layers, and the one or more layers may include silicon oxide, silicon dioxide, and/or a high-k dielectric material. The high-k dielectric material included in the gate dielectric layer of the transistor 1240 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Although not specifically shown in FIG. 4, gate contacts to the gate 1222 may be made as described above with reference to the gate 206 and gate via contacts formed by the via contact patterning method described herein.

The S/D regions 1220 may be formed within the substrate 1202 adjacent to the gate 1222 of each transistor 1240, using any suitable processes known in the art. For example, the S/D regions 1220 may be formed using either an implantation/diffusion process or a deposition process. In the former process, dopants such as boron, aluminum, antimony, phosphorous, or arsenic may be ion-implanted into the substrate 1202 to form the S/D regions 1220. An annealing process that activates the dopants and causes them to diffuse farther into the substrate 1202 may follow the ion implantation process. In the latter process, an epitaxial deposition process may provide material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220. In some embodiments, an etch process may be performed before the epitaxial deposition to create recesses in the substrate 1202 in which the material for the S/D regions 1220 is deposited.

Electrical signals, such as power and/or input/output (I/O) signals, may be routed to and/or from the transistors 1240 of the device layer 1204 through one or more interconnect layers disposed on the device layer 1204 (illustrated in FIG. 4 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1410 may form an ILD stack 1219 of the IC device 1200. Although not specifically shown in FIG. 4, trench contact contacts to the interconnect structures 1228 of the interconnect layers 1206-1210 may be made as described above with reference to the trench contact 204 and trench via contacts formed by the via contact patterning method described herein. In general, embodiments of the present disclosure may be used for any interconnect layer (e.g., it may be used for gate contacts, but it can be extended to any layer).

Figure 5:
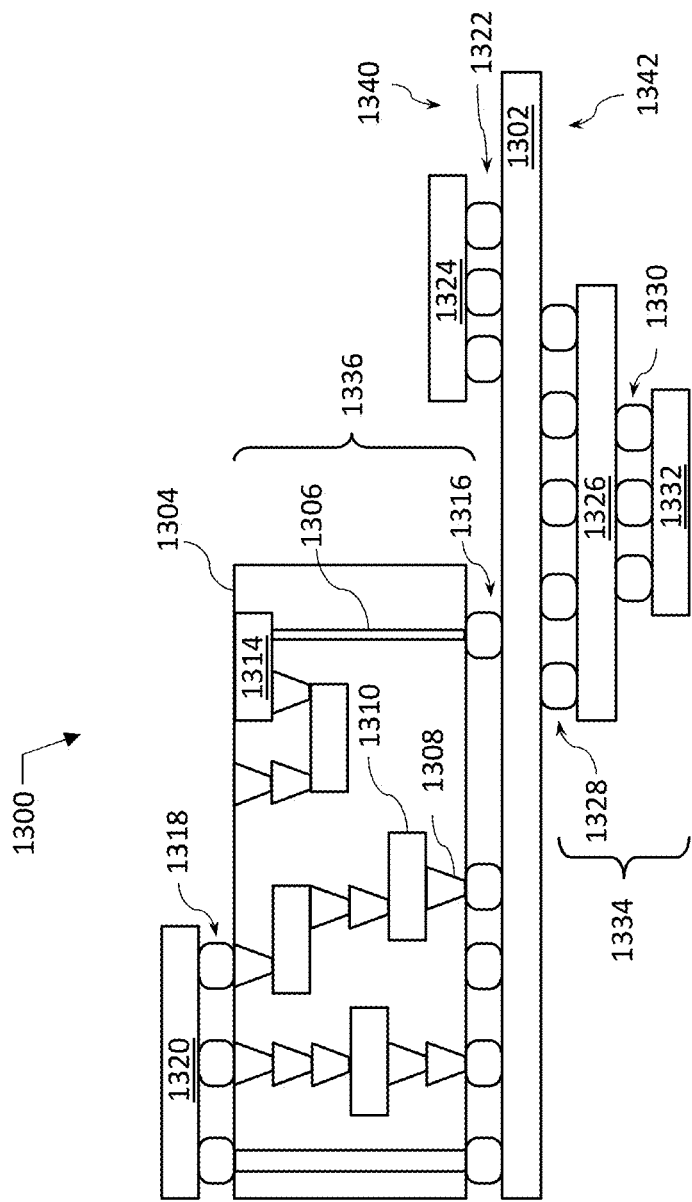
FIG. 5 is a cross-sectional side view of an IC device assembly that may include one or more IC structures with via contacts formed by the via contact patterning method in accordance with any of the embodiments disclosed herein.

The interconnect structures 1228 may be arranged within the interconnect layers 1206-1410 to route electrical signals according to a wide variety of designs (in particular, the arrangement is not limited to the particular configuration of interconnect structures 1228 depicted in FIG. 5). Although a particular number of interconnect layers 1206-1410 is depicted in FIG. 5, embodiments of the present disclosure include IC devices having more or fewer interconnect layers than depicted.

In some embodiments, the interconnect structures 1228 may include trench contact structures 1228a (sometimes referred to as "lines") and/or via structures 1228b (sometimes referred to as "holes") filled with an electrically conductive material such as a metal. The trench contact structures 1228a may be arranged to route electrical signals in a direction of a plane that is substantially parallel with a surface of the substrate 1202 upon which the device layer 1204 is formed. For example, the trench contact structures 1228a may route electrical signals in a direction in and out of the page from the perspective of FIG. 4. The via structures 1228b may be arranged to route electrical signals in a direction of a plane that is substantially perpendicular to the surface of the substrate 1202 upon which the device layer 1204 is formed. In some embodiments, the via structures 1228b may electrically couple trench contact structures 1228a of different interconnect layers 1206-1410 together.

The interconnect layers 1206-1210 may include a dielectric material 1226 disposed between the interconnect structures 1228, as shown in FIG. 4. The dielectric material 1226 may take the form of any of the embodiments of the dielectric material provided between the interconnects of the IC structures disclosed herein, for example any of the embodiments discussed herein with reference to the dielectric materials 208 or 252, described herein.

In some embodiments, the dielectric material 1226 disposed between the interconnect structures 1228 in different ones of the interconnect layers 1206-1210 may have different compositions. In other embodiments, the composition of the dielectric material 1226 between different interconnect layers 1206-1210 may be the same.

A first interconnect layer 1206 (referred to as Metal 1 or "M1") may be formed directly on the device layer 1204. In some embodiments, the first interconnect layer 1206 may include trench contact structures 1228a and/or via structures 1228b, as shown. The trench contact structures 1228a of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some embodiments, the second interconnect layer 1208 may include via structures 1228b to couple the trench contact structures 1228a of the second interconnect layer 1208 with the trench contact structures 1228a of the first interconnect layer 1206. Although the trench contact structures 1228a and the via structures 1228b are structurally delineated with a line within each interconnect layer (e.g., within the second interconnect layer 1208) for the sake of clarity, the trench contact structures 1228a and the via structures 1228b may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206.

The IC device 1200 may include a solder resist material 1234 (e.g., polyimide or similar material) and one or more bond pads 1236 formed on the interconnect layers 1206-1210. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

FIG. 5 is a cross-sectional side view of an IC device assembly 1300 that may include components having or being associated with (e.g. being electrically connected by means of) one or more IC structures with via contacts formed by the via contact patterning method in accordance with any of the embodiments disclosed herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. In particular, any suitable ones of the components of the IC device assembly 1300 may include any of the metallization stacks 100 disclosed herein.

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 5 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 5), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 5, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 3B), an IC device (e.g., the IC device 1200 of FIG. 4), or any other suitable component. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 5, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through-silicon vias (TSVs) 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 5 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 6:
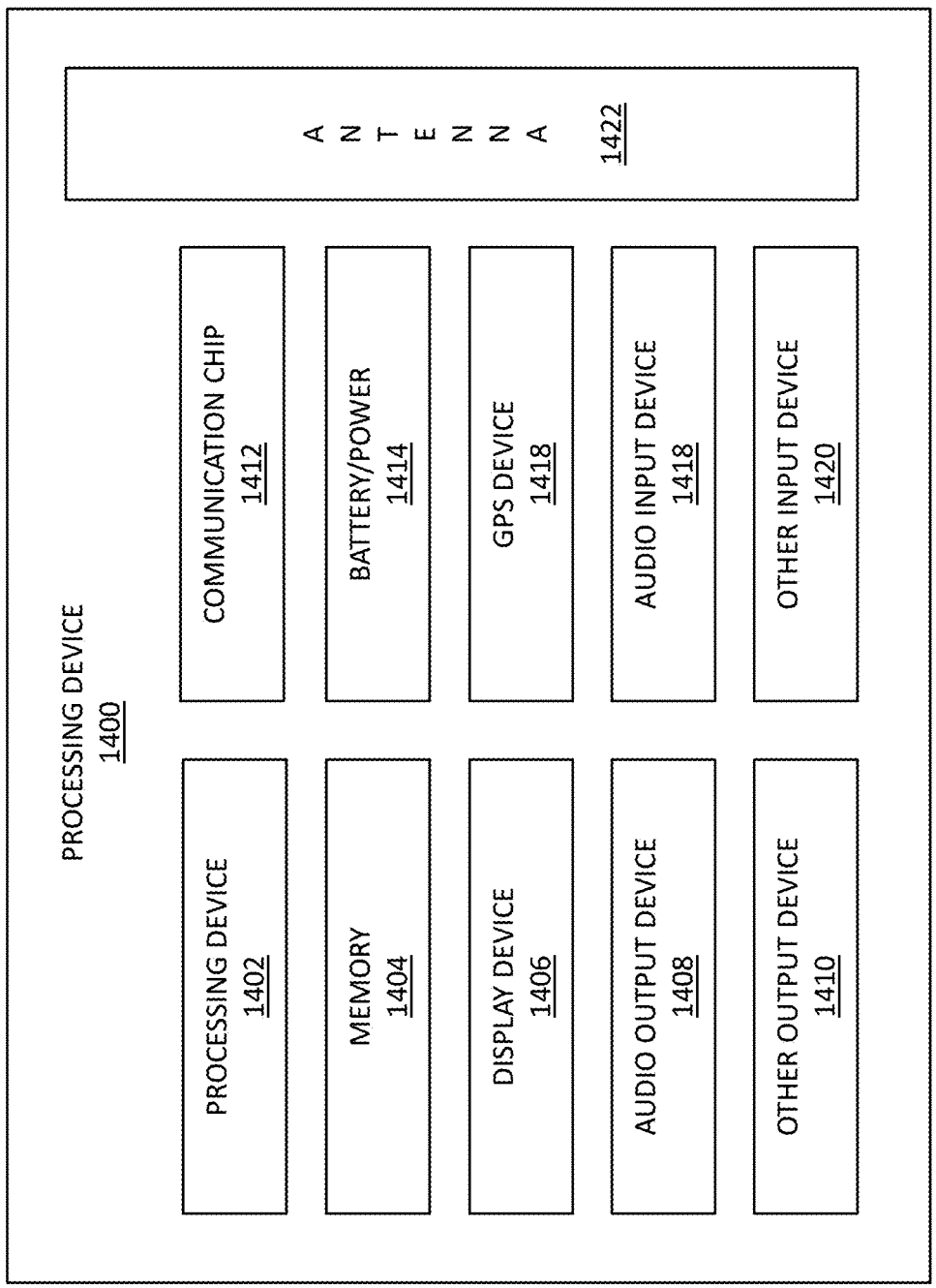
FIG. 6 is a block diagram of an example computing device that may include one or more IC structures with via contacts formed by the via contact patterning method in accordance with any of the embodiments disclosed herein.

FIG. 6 is a block diagram of an example computing device 1400 that may include one or more components including one or more IC structures with via contacts formed by the via contact patterning method in accordance with any of the embodiments disclosed herein. For example, any suitable ones of the components of the computing device 1400 may include a die (e.g., the die 1102 of FIG. 3B) having one or more IC structures with via contacts formed by the via contact patterning method as described herein. Any one or more of the components of the computing device 1400 may include, or be included in, an IC device 1200 (FIG. 4). Any one or more of the components of the computing device 1400 may include, or be included in, an IC device assembly 1300 (FIG. 5).

A number of components are illustrated in FIG. 6 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may not include one or more of the components illustrated in FIG. 6, but the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1424 or an audio output device 1408, but may include audio input or output device interface circuitry (e.g., connectors and supporting circuitry) to which an audio input device 1424 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-MRAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The computing device 1400 may include a global positioning system (GPS) device 1418 (or corresponding interface circuitry, as discussed above). The GPS device 1418 may be in communication with a satellite-based system and may receive a location of the computing device 1400, as known in the art.

The computing device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include an other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

The Following Paragraphs Provide Various Examples of the Embodiments Disclosed Herein.

Example 1 provides am IC structure that includes a support structure (e.g., a substrate), a pattern of alternating first and second electrically conductive structures over a support structure, and a via contact electrically coupled to one of the second electrically conductive structures (e.g., the gate contact 254 coupled to one of the gates 206). Each pair of the first and second electrically conductive structures is separated (electrically isolated from one another) by a first dielectric material (e.g., the dielectric material 208 shown in FIG. 2J). A height of the first electrically conductive structures is greater than a height of the second electrically conductive structures. The IC structure further includes a second dielectric material (which may be a plurality of different material layers, e.g., the one or more dielectric materials 222, 224 of the first spacer and, optionally, also the second spacer material 248, described herein), having a different material composition from the first dielectric material, provided between the via contact and one of the first electrically conductive structures (e.g., one of the trench contacts 204) that is adjacent to the one of the second electrically conductive structures.

Example 2 provides the IC structure according to example 1, where the first dielectric material (e.g., the dielectric material 208 shown in FIG. 2J) includes one or more of hafnium oxide, silicon oxide, silicon oxynitride, silicon oxycarbide nitride, silicon oxycarbide, titanium oxide, zirconium oxide, tin oxide, aluminum oxide, silicon nitride, and aluminum nitride.

Example 3 provides the IC structure according to examples 1 or 2, where the second dielectric material (e.g., the one or more dielectric materials 222, 224 of the first spacer and, optionally, also the second spacer material 248, shown in FIG. 2J) includes one or more of hafnium oxide, silicon oxide, silicon oxynitride, silicon oxycarbide nitride, silicon oxycarbide, titanium oxide, zirconium oxide, tin oxide, aluminum oxide, silicon nitride, and aluminum nitride.

Example 4 provides the IC structure according to any one of the preceding examples, where a width of the via contact in a plane above the first electrically conductive structures (e.g., the width 264, shown in FIG. 2J) is greater than a width of the via contact between two adjacent structures of the first electrically conductive structures (e.g., the width 266, shown in FIG. 2J).

Example 5 provides the IC structure according to any one of the preceding examples, where the via contact has a first width (e.g., the width 266, shown in FIG. 2J) in a first plane, a second width (e.g., the width 268, shown in FIG. 2J) in a second plane, and a third width (e.g., the width 264, shown in FIG. 2J) in a third plane, where the first plane is closer to the support structure than each of the second plane and the third plane, the second plane is closer to the support structure than the third plane, the first width is smaller than the third width, and the second width is smaller than the first width.

Example 6 provides the IC structure according to any one of the preceding examples, where the one of the second electrically conductive structures is a gate of a transistor.

Example 7 provides the IC structure according to any one of the preceding examples, where the first electrically conductive structures are trench contact interconnects.

Example 8 provides an IC structure, including a support structure (e.g., a substrate), two first electrically conductive structures over a support structure, a second electrically conductive structure over the support structure, and a via contact electrically coupled to the second electrically conductive structure. The second electrically conductive structure is between the two first electrically conductive structures. A height of each of the two first electrically conductive structures is greater than a height of the second electrically conductive structure. A width (e.g., the width 266, shown in FIG. 2J) of the via contact at a first distance from the support structure is smaller than a width (e.g., the width 264, shown in FIG. 2J) of the via contact at a second distance from the support structure, the second distance being greater than the first distance.

Example 9 provides the IC structure according to example 8, where an overlap between a portion of the via contact in a plane above the two first electrically conductive structures and at least one of the two first electrically conductive structures (e.g., the width of the regions 260 or 262 shown in FIG. 2J) is between about 10 and 30 nanometers, including all values and ranges therein.

Example 10 provides the IC structure according to examples 8 or 9, where a portion of the via contact in a plane above the two first electrically conductive structures overlaps at least one of the two first electrically conductive structures.

Example 11 provides the IC structure according to any one of examples 8-10, where the second electrically conductive structure is separated (electrically isolated) from each of the two first electrically conductive structures by a first dielectric material (e.g., the dielectric material 208 shown in FIG. 2J).

Example 12 provides the IC structure according to example 11, where the via contact is separated (electrically isolated) from each of the two first electrically conductive structures by a second dielectric material (which may be a plurality of different material layers, e.g., the one or more dielectric materials 222, 224 of the first spacer and, optionally, also the second spacer material 252, described herein), and where a material composition of the second dielectric material is different from a material composition of the first dielectric material.

Example 13 provides the IC structure according to any one of examples 8-12, where the second electrically conductive structure is a gate of a transistor.

Example 14 provides the IC structure according to any one of examples 8-13, where the two first electrically conductive structures are trench contact interconnects.

Example 15 provides a method of forming a semiconductor device. The method includes providing a pattern of alternating first and second electrically conductive structures over a support structure (e.g., a substrate), where each pair of the first and second electrically conductive structures is separated by a dielectric material (which may include multiple layers of different dielectric materials), and where a height of the first electrically conductive structures is greater than a height of the second electrically conductive structures. The method further includes forming openings in the pattern to expose the second electrically conductive structures, depositing one or more dielectric materials over the first electrically conductive structures and over sidewalls and bottoms of the openings, and providing a protective helmet material (to protect the top of the feature) over the one or more dielectric materials over the first electrically conductive structures. After providing the helmet material, the method includes removing the one or more dielectric materials from the bottoms of the openings to expose the second electrically conductive structures. After removing the one or more dielectric materials from the bottoms of the openings, the method includes removing the helmet material, and, after removing the helmet material, depositing a further dielectric material over the first electrically conductive structures and over sidewalls and bottoms of the openings. After depositing the further dielectric material, the method forming a first via contact over one of the first electrically conductive structures and forming a second via contact over one of the second electrically conductive structures.

Example 16 provides the method according to example 15, where depositing the one or more dielectric materials over the first electrically conductive structures and over the sidewalls and bottoms of the openings includes performing a conformal deposition of a layer of the one or more dielectric materials.

Example 17 provides the method according to example 16, where a thickness of the layer is between about 5 and 15 nanometers.

Example 18 provides the method according to any one of examples 15-17, where providing the protective helmet material includes performing a direction deposition, e.g. spinning the wafer during CVD deposition or using a process that does not fill small trench contacts effectively.

Example 19 provides the method according to any one of examples 15-18, where forming the second via contact includes removing the further dielectric material from a portion over the one of the second electrically conductive structures to form electrical contact between the second via contact and the one of the second electrically conductive structures.

Example 20 provides the method according to example 19, where removing the further dielectric material includes performing an anisotropic etch to remove the further dielectric material from the portion over the one of the second electrically conductive structures.

The invention claimed is:

1. An integrated circuit (IC) device, comprising an IC structure that includes:
   a support structure;
   a pattern of alternating first and second electrically conductive structures over the support structure, wherein an individual pair of the first and second electrically conductive structures is separated by a first dielectric material, and a height of the first electrically conductive structures is greater than a height of the second electrically conductive structures;
   a via contact electrically coupled to one of the second electrically conductive structures; and
   a second dielectric material between the via contact and at least one of the first electrically conductive structures that is adjacent to the one of the second electrically conductive structures,
   wherein the via contact has a first width in a first plane, a second width in a second plane, and a third width in a third plane, and wherein the first plane is closer to the support structure than each of the second plane and the third plane, the second plane is closer to the support structure than the third plane, the first width is smaller than the third width, and the second width is smaller than the first width.

2. The IC device according to claim 1, wherein the first dielectric material includes one or more of hafnium oxide, silicon oxide, silicon oxynitride, silicon oxycarbide nitride, silicon oxycarbide, titanium oxide, zirconium oxide, tin oxide, aluminum oxide, silicon nitride, and aluminum nitride.

3. The IC device according to claim 1, wherein the second dielectric material includes one or more of hafnium oxide, silicon oxide, silicon oxynitride, silicon oxycarbide nitride, silicon oxycarbide, titanium oxide, zirconium oxide, tin oxide, aluminum oxide, silicon nitride, and aluminum nitride, and has a material composition that is different from a material composition of the first dielectric material.

4. The IC device according to claim 1, wherein a width of the via contact in a plane above the first electrically conductive structures is greater than a width of the via contact between two adjacent ones of the first electrically conductive structures.

5. The IC device according to claim 1, wherein the one of the second electrically conductive structures is a gate of a transistor.

6. The IC device according to claim 1, wherein the first electrically conductive structures are trench contact interconnects.

7. The IC device according to claim 1, further comprising a further component, coupled to the IC structure.

8. The IC device according to claim 7, wherein the further component is one of a circuit board, a motherboard, a printed circuit board, an interposer, or another IC structure.

9. An integrated circuit (IC) device, comprising an IC structure that includes:
   a support structure;
   two first electrically conductive structures over the support structure;
   a second electrically conductive structure over the support structure, between the two first electrically conductive structures, wherein:
      a height of each of the two first electrically conductive structures is greater than a height of the second electrically conductive structure,
      the second electrically conductive structure is separated from each of the two first electrically conductive structures by a first dielectric material, and
      for each of the two first electrically conductive structures, a liner of a second dielectric material wraps around a top of the each of the two first electrically conductive structures and portions of sidewalls of the each of the two first electrically conductive structures that are above the first dielectric material; and a via contact electrically coupled to the second electrically conductive structure, wherein a portion of the via contact in a plane above the two first electrically conductive structures overlaps at least one of the two first electrically conductive structures, with a portion of the liner of the second dielectric material that is over the top of the at least one of the two first electrically conductive structures being between the portion of the via contact and the at least one of the two first electrically conductive structures.

10. The IC device according to claim 9, wherein an overlap between a portion of the via contact in a plane above the two first electrically conductive structures and at least one of the two first electrically conductive structures is between about 10 and 30 nanometers.

11. The IC device according to claim 9, wherein a material composition of the second dielectric material is different from a material composition of the first dielectric material.

12. The IC device according to claim 9, wherein the second electrically conductive structure is a gate of a transistor.

13. The IC device according to claim 9, wherein the two first electrically conductive structures are trench contact interconnects.

14. The IC device according to claim 9, further comprising a further component, coupled to the IC structure.

15. The IC device according to claim 14, wherein the further component is one of a circuit board, a motherboard, a printed circuit board, an interposer, or another IC structure.

16. An integrated circuit (IC) device, comprising an IC structure that includes:

a support structure;

two first electrically conductive structures over the support structure;

a second electrically conductive structure over the support structure, between the two first electrically conductive structures, wherein heights of the two first electrically conductive structures are greater than a height of the second electrically conductive structure, and the second electrically conductive structure is separated from each of the two first electrically conductive structures by a first dielectric material, where a top of the first dielectric material is substantially aligned with a top of the second electrically conductive structure;

a via contact electrically coupled to the second electrically conductive structure; and a second dielectric material between the via contact and at least one of the two first electrically conductive structures, wherein a material composition of the second dielectric material is different from a material composition of the first dielectric material.

17. The IC device according to claim 16, wherein the second dielectric material between the via contact and the at least one of the two first electrically conductive structures is a liner of the second dielectric material, the liner wrapping around a top of and upper portions of sidewalls of the at least one of the two first electrically conductive structures.

18. The IC device according to claim 17, wherein the liner is a first liner, and wherein the IC structure further includes a second liner of a third dielectric material, wrapping around the first liner, where a material composition of the third dielectric material is different from a material composition of the second dielectric material.

19. The IC device according to claim 18, wherein a material composition of the third dielectric material is different from a material composition of the first dielectric material.

20. The IC device according to claim 17, wherein a portion of the via contact in a plane above the two first electrically conductive structures overlaps the at least one of the two first electrically conductive structures, with a portion of the liner being between the at least one of the two first electrically conductive structures and the portion of the via contact that overlaps the at least one of the two first electrically conductive structures.

* * * * *